(12) United States Patent
Seino et al.

(10) Patent No.: US 12,421,609 B2
(45) Date of Patent: Sep. 23, 2025

(54) METHOD OF PROCESSING SUBSTRATE, METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Atsuro Seino, Toyama (JP); Takuya Joda, Toyama (JP); Arito Ogawa, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/587,907

(22) Filed: Jan. 28, 2022

(65) Prior Publication Data
US 2022/0267905 A1     Aug. 25, 2022

(30) Foreign Application Priority Data

Feb. 19, 2021   (JP) .................................. 2021-025294

(51) Int. Cl.
  *C23C 16/455*   (2006.01)
  *C23C 16/44*    (2006.01)
  *C23C 16/52*    (2006.01)

(52) U.S. Cl.
  CPC .......... *C23C 16/52* (2013.01); *C23C 16/4408* (2013.01)

(58) Field of Classification Search
  None
  See application file for complete search history.

(56) References Cited

U.S. PATENT DOCUMENTS

| 2006/0078678 | A1  | 4/2006  | Won et al. |
| 2013/0095668 | A1  | 4/2013  | Saito et al. |
| 2014/0295667 | A1* | 10/2014 | Kaga ................. C23C 16/45546 |
|              |     |         | 438/680 |
| 2018/0037991 | A1* | 2/2018  | Okura ..................... C23C 16/52 |
| 2019/0019673 | A1* | 1/2019  | Ogawa ................. C23C 16/347 |
| 2020/0194269 | A1  | 6/2020  | Ogawa et al. |

(Continued)

FOREIGN PATENT DOCUMENTS

| JP | 2011-252221 A    | 12/2011 |
| JP | 2017-069407 A    | 4/2017  |
| KR | 10-2006-0032923 A | 4/2006  |

(Continued)

OTHER PUBLICATIONS

Korean Office Action issued on Nov. 24, 2023 for Korean Patent Application No. 10-2022-0013312.

*Primary Examiner* — David P Turocy
(74) *Attorney, Agent, or Firm* — Volpe Koenig (57) ABSTRACT

There is provided a technique that includes (a) supplying a precursor gas containing a first element and halogen to a substrate; (b) supplying a first reducing gas to the substrate; (c) supplying a second reducing gas to the substrate; and (d) supplying the precursor gas to the substrate, wherein the technique further includes: (e) starting (b) during (a) and ending (a) during (b); (f) performing (d) after (e) without purging between (e) and (d); (g) performing (c) after (f); and (h) forming a film containing the first element on the substrate by performing (e), (f), and (g) sequentially in this order a predetermined number of times.

16 Claims, 6 Drawing Sheets

(56) References Cited

U.S. PATENT DOCUMENTS

2021/0395891 A1   12/2021   Joda et al.

FOREIGN PATENT DOCUMENTS

| KR | 10-2011-0075915 A | 7/2011 |
| KR | 10-2018-0118683 A | 10/2018 |
| WO | 2019/058608 A1 | 3/2019 |
| WO | 2020/179474 A1 | 9/2020 |

\* cited by examiner

METHOD OF PROCESSING SUBSTRATE, METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2021-025294, filed on Feb. 19, 2021, the entire contents of which are incorporated herein by reference.

TECHNICAL FIELD

The present disclosure relates to a method of processing a substrate, a method of manufacturing a semiconductor device, a substrate processing apparatus, and a recording medium.

BACKGROUND

For example, a low resistance metal film is used for a word line of a 3D NAND flash memory or a DRAM having a three-dimensional structure. Further, a barrier film may be formed between the metal film and an insulating film.

For example, in the case of a 3D NAND structure, as the number of layers formed on a substrate increases, the aspect ratio of a groove formed on the substrate increases to increase the surface area, which makes it necessary to improve the step coverage performance of film formation on a substrate having a deeper groove. In order to improve the step coverage performance, it is necessary to supply sufficient gas to bottom of the device.

SUMMARY

Some embodiments of the present disclosure provide a technique capable of improving the step coverage performance of a film formed on a substrate.

According to one embodiment of the present disclosure, there is provided a technique that includes (a) supplying a precursor gas containing a first element and halogen to a substrate; (b) supplying a first reducing gas to the substrate; (c) supplying a second reducing gas to the substrate; and (d) supplying the precursor gas to the substrate, wherein the technique further includes: (e) starting (b) during (a) and ending (a) during (b); (f) performing (d) after (e) without purging between (e) and (d); (g) performing (c) after (f); and (h) forming a film containing the first element on the substrate by performing (e), (f), and (g) sequentially in this order a predetermined number of times.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

One embodiment of the present disclosure will now be described with reference to FIGS. 1 to 4. The drawings used in the following description are all schematic, and the dimensional relationship, ratios, and the like of various elements shown in figures do not always match the actual ones. Further, the dimensional relationship, ratios, and the like of various elements between plural figures do not always match each other.

(1) Configuration of Substrate Processing Apparatus

Figure 1:
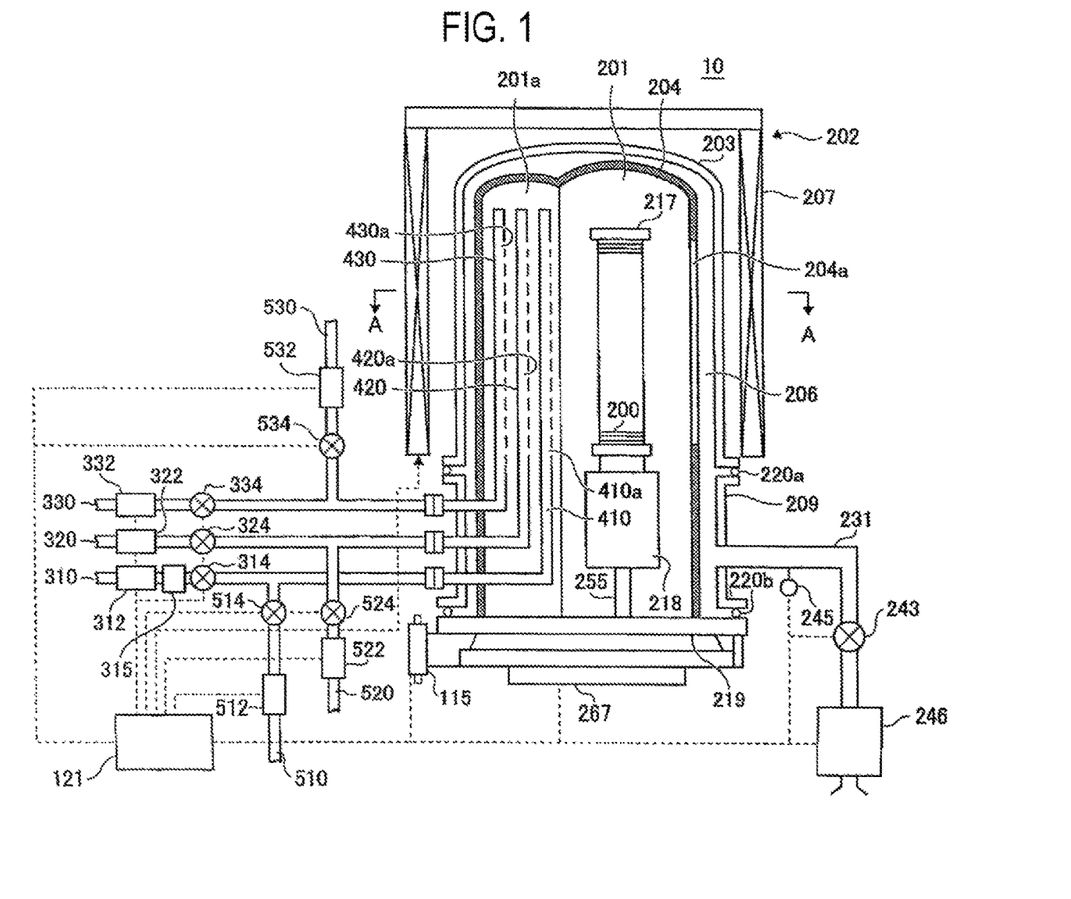
FIG. 1 is a longitudinal sectional view showing the outline of a vertical process furnace of a substrate processing apparatus according to an embodiment of the present disclosure.

A substrate processing apparatus 10 includes a process furnace 202 in which a heater 207 as a heating means (a heating mechanism or a heating system) is installed. The heater 207 has a cylindrical shape and is supported by a heat base (not shown) as a support plate so as to be vertically installed.

An outer tube 203 forming a process container is disposed inside the heater 207 to be concentric with the heater 207. The outer tube 203 is made of, for example, a heat resistant material such as quartz ($SiO_2$) or silicon carbide (SiC) and has a cylindrical shape with its upper end closed and its lower end opened. A manifold (inlet flange) 209 is disposed below the outer tube 203 to be concentric with the outer tube 203. The manifold 209 is made of, for example, a metal material such as stainless steel (SUS) and is formed in a cylindrical shape with its upper and lower ends opened. An O-ring 220a serving as a seal member is installed between the upper end portion of the manifold 209 and the outer tube 203. When the manifold 209 is supported by the heater base, the outer tube 203 is in a state of being installed vertically.

An inner tube 204 forming the process container is disposed inside the outer tube 203. The inner tube 204 is made of, for example, a heat resistant material such as quartz (SiO$_2$) or silicon carbide (SiC) and is formed in a cylindrical shape with it upper end closed and its lower end opened. The process container mainly includes the outer tube 203, the inner tube 204, and the manifold 209. A process chamber 201 is formed in a hollow cylindrical portion (inside the inner tube 204) of the process container.

The process chamber 201 is configured to be able to accommodate wafers 200 as substrates in a state where the wafers 200 are arranged in a horizontal posture and in multiple stages in the vertical direction by a boat 217 which will be described later.

Nozzles 410, 420, and 430 are installed in the process chamber 201 so as to penetrate through a sidewall of the manifold 209 and the inner tube 204. Gas supply pipes 310, 320, and 330 are connected to the nozzles 410, 420, and 430, respectively. However, the process furnace 202 of the present embodiment is not limited to the above-described shape.

Mass flow controllers (MFCs) 312, 322, and 332, which are flow rate controllers (flow rate control parts), are installed in the gas supply pipes 310, 320, and 330, respectively, sequentially from the upstream side. Further, valves 314, 324, and 334, which are opening/closing valves, are installed in the gas supply pipes 310, 320, and 330, respectively. Further, a storage 315 for retaining a gas is installed between the MFC 312 and the valve 314 on the downstream side of the MFC 312 of the gas supply pipe 310 and on the upstream side of the valve 314 of the gas supply pipe 310. That is, it is configured so that a predetermined amount of gas can be retained in the storage before a gas is supplied, and the gas retained in the storage can be used at the time of gas supply. Gas supply pipes 510, 520, and 530 for supplying an inert gas are connected at the downstream side of the valves 314, 324, and 334 of the gas supply pipes 310, 320, and 330, respectively. MFCs 512, 522, and 532, which are flow rate controllers (flow rate control parts), and valves 514, 524, and 534, which are opening/closing valves, are installed in the gas supply pipes 510, 520, and 530, respectively, sequentially from the upstream side.

Figure 2:
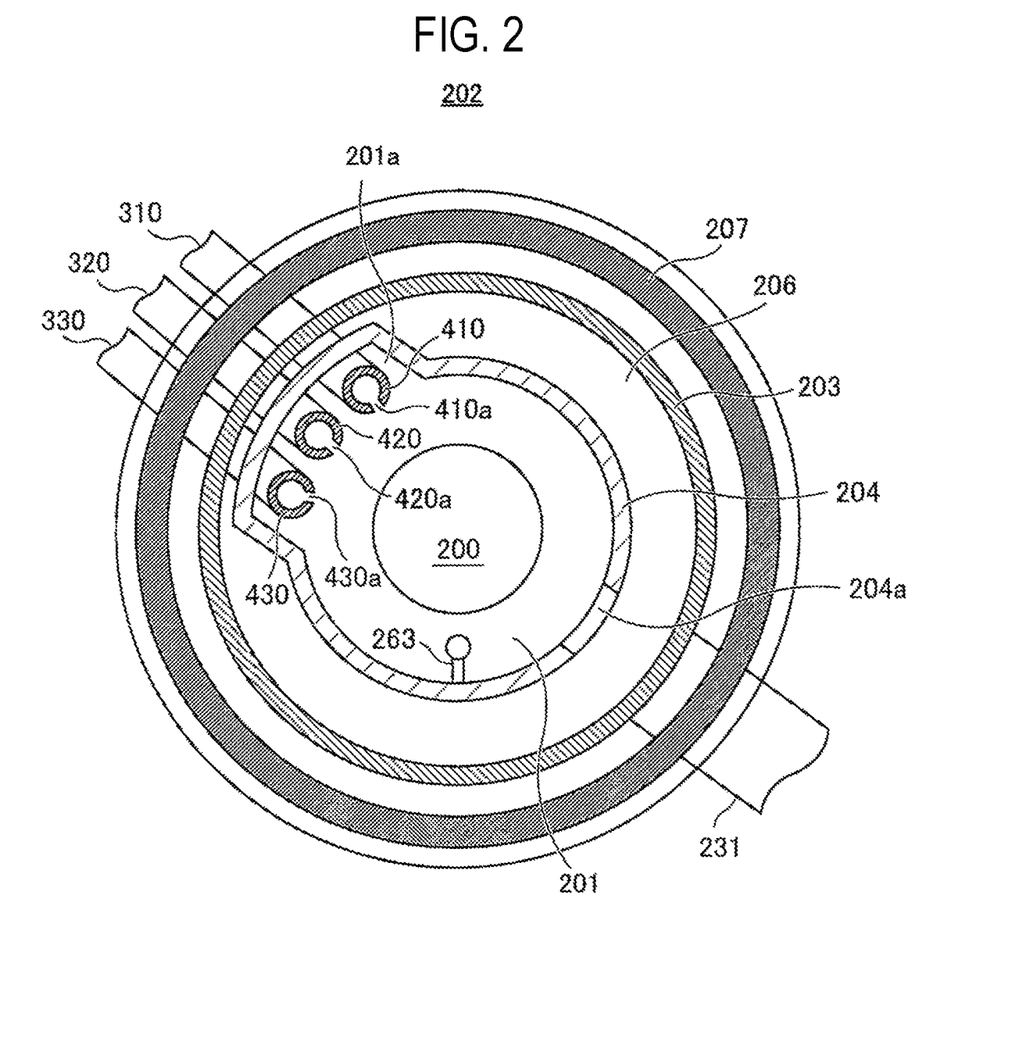
FIG. 2 is a schematic cross-sectional view taken along line A-A in FIG. 1.

The nozzles 410, 420, and 430 are connected to the leading ends of the gas supply pipes 310, 320, and 330, respectively. The nozzles 410, 420, and 430 are configured as L-shaped nozzles, and their horizontal portions are installed so as to penetrate through the sidewall of the manifold 209 and the inner tube 204. The vertical portions of the nozzles 410, 420, and 430 are installed inside a channel-shaped (groove-shaped) preliminary chamber 201a formed so as to protrude outward in the radial direction of the inner tube 204 and extend in the vertical direction thereof and are also installed in the preliminary chamber 201a toward the upper side (upper side in the arrangement direction of the wafers 200) along the inner wall of the inner tube 204.

The nozzles 410, 420, and 430 are installed so as to extend from a lower region of the process chamber 201 to an upper region of the process chamber 201, and a plurality of gas supply holes 410a, 420a, and 430a are formed at positions facing the wafers 200, respectively. Thus, a process gas is supplied from the gas supply holes 410a, 420a, and 430a of the respective nozzles 410, 420, and 430 to the wafers 200. A plurality of gas supply holes 410a, 420a, and 430a are installed from a lower portion of the inner tube 204 to an upper portion thereof and have the same aperture area at the same aperture pitch. However, the gas supply holes 410a, 420a, and 430a are not limited to the above-described shape.

For example, the aperture area may be gradually increased from the lower portion of the inner tube 204 to the upper portion thereof. This makes it possible to make the flow rate of the process gas supplied from the gas supply holes 410a, 420a, and 430a more uniform.

The plurality of gas supply holes 410a, 420a, and 430a of the nozzles 410, 420, and 430 are installed at height positions from a lower portion of the boat 217, which will be described later, to an upper portion thereof. Therefore, the process gas supplied into the process chamber 201 from the gas supply holes 410a, 420a, and 430a of the nozzles 410, 420, and 430 is supplied to the entire region of the wafers 200 accommodated from the lower portion of the boat 217 to the upper portion thereof. The nozzles 410, 420, and 430 are installed so as to extend from the lower region of the process chamber 201 to the upper region thereof, but may be installed so as to extend to the vicinity of a ceiling of the boat 217.

As the process gas, a precursor gas containing a first element and halogen is supplied from the gas supply pipe 310 into the process chamber 201 via the MFC 312, the storage 315, the valve 314, and the nozzle 410.

As the process gas, a first reducing gas is supplied from the gas supply pipe 320 into the process chamber 201 via the MFC 322, the valve 324, and the nozzle 420.

As the process gas, a second reducing gas is supplied from the gas supply pipe 330 into the process chamber 201 via the MFC 332, the valve 334, and the nozzle 430. In the present disclosure, the second reducing gas is used as a reaction gas reacting with the precursor gas.

As an inert gas, for example, a N$_2$ gas is supplied from the gas supply pipes 510, 520, and 530 from the process chamber 201 via the MFCs 512, 522, and 532, the valves 514, 524, and 534, and the nozzles 410, 420, and 430, respectively. Hereinafter, an example in which the N$_2$ gas is used as the inert gas will be described. However, as the inert gas, in addition to the N$_2$ gas, it may be possible to use, e.g., a rare gas such as an argon (Ar) gas, a helium (He) gas, a neon (Ne) gas, a xenon (Xe) gas, or the like.

A process gas supply system mainly includes the gas supply pipes 310, 320, and 330, the MFCs 312, 322, and 332, the valves 314, 324, and 334, and the nozzles 410, 420, and 430. However, the process gas supply system may include only the nozzles 410, 420, and 430. The process gas supply system may be simply referred to as a gas supply system. When the precursor gas is flowed from the gas supply pipe 310, a precursor gas supply system mainly includes the gas supply pipe 310, the MFC 312, and the valve 314. However, the precursor gas supply system may include the nozzle 410. Further, when the first reducing gas is flowed from the gas supply pipe 320, a first reducing gas supply system mainly includes the gas supply pipe 320, the MFC 322, and the valve 324. However, the first reducing gas supply system may include the nozzle 420. Further, when the second reducing gas is flowed from the gas supply pipe 330, a second reducing gas supply system mainly includes the gas supply pipe 330, the MFC 332, and the valve 334. However, the second reducing gas supply system may include the nozzle 430. When the second reducing gas as the reaction gas is supplied from the gas supply pipe 330, the second reducing gas supply system may be referred to as a reaction gas supply system. Further, an inert gas supply system mainly includes the gas supply pipes 510, 520, and 530, the MFCs 512, 522, and 532, and the valves 514, 524, and 534.

A method of supplying a gas in the present embodiment is to transfer a gas via the nozzles 410, 420, and 430 arranged in the preliminary chamber 201a in an annular vertically long space defined by the inner wall of the inner tube 204 and the ends of a plurality of wafers 200. Then, the gas is ejected into the inner tube 204 from the plurality of gas supply holes 410a, 420a, and 430a formed at positions of the nozzles 410, 420, and 430, which face the wafers. More specifically, the process gas or the like is ejected toward a direction parallel to the surface of the wafers 200 by the gas supply hole 410a of the nozzle 410, the gas supply hole 420a of the nozzle 420, and the gas supply hole 430a of the nozzle 430.

An exhaust hole (exhaust port) 204a is a through-hole formed in a sidewall of the inner tube 204 at a position facing the nozzles 410, 420, and 430. For example, the exhaust hole 204a is a slit-shaped through-hole formed elongated in the vertical direction. A gas supplied into the process chamber 201 from the gas supply holes 410a, 420a, and 430a of the nozzles 410, 420, and 430 and flowing on the surface of the wafers 200 passes through the exhaust hole 204a and flows into an exhaust passage 206 including a gap formed between the inner tube 204 and the outer tube 203. Then, the gas flowed into the exhaust passage 206 flows into an exhaust pipe 231 and is discharged to the outside of the process furnace 202.

The exhaust hole 204a is formed at a position facing the plurality of wafers 200, and a gas supplied from the gas supply holes 410a, 420a, and 430a to the vicinity of the wafers 200 in the process chamber 201 flows toward the horizontal direction and then flows into the exhaust passage 206 through the exhaust hole 204a. The exhaust hole 204a is not limited to the slit-shaped through-hole, but may be configured by a plurality of holes.

The exhaust pipe 231 for exhausting an internal atmosphere of the process chamber 201 is installed in the manifold 209. A pressure sensor 245, which is a pressure detector (pressure detecting part) for detecting a pressure inside the process chamber 201, an auto pressure controller (APC) valve 243, and a vacuum pump 246 as a vacuum-exhausting device, are connected to the exhaust pipe 231 sequentially from the upstream side. The APC valve 243 can perform or stop a vacuum-exhausting operation in the process chamber 201 by opening or closing the valve while the vacuum pump 246 is actuated, and can also adjust the pressure inside the process chamber 201 by adjusting an opening degree of the valve while the vacuum pump 246 is actuated. An exhaust system mainly includes the exhaust hole 204a, the exhaust passage 206, the exhaust pipe 231, the APC valve 243, and the pressure sensor 245. The exhaust system may include the vacuum pump 246.

A seal cap 219 as a furnace opening lid capable of air-tightly closing a lower end opening of the manifold 209 is installed under the manifold 209. The seal cap 219 is configured to come into contact with the lower end of the manifold 209 from the lower side in the vertical direction. The seal cap 219 is made of, for example, metal such as stainless steel (SUS), and is formed in a disc shape. An O-ring 220b as a seal in contact with a lower end of the manifold 209 is installed on an upper surface of the seal cap 219. A rotator 267 for rotating the boat 217 in which the wafers 200 are accommodated is installed on the opposite side of the process chamber 201 with respect to the seal cap 219. A rotary shaft 255 of the rotator 267 penetrates through the seal cap 219 and is connected to the boat 217. The rotator 267 is configured to rotate the wafers 200 by rotating the boat 217. The seal cap 219 is configured to be vertically raised or lowered by a boat elevator 115 as an elevator vertically installed outside the outer tube 203. The boat elevator 115 is configured to be able to load/unload the boat 217 into/out the process chamber 201 by raising or lowering the seal cap 219. The boat elevator 115 is configured as a transfer device (transfer mechanism) which transfers the boat 217 and the wafers 200 accommodated in the boat 217 into/out of the process chamber 201.

The boat 217 serving as a substrate support is configured to arrange a plurality of wafers 200, for example, 25 to 200 wafers 200, at intervals in the vertical direction in a horizontal posture with the centers of the wafers 200 aligned with one another. The boat 217 is made of, for example, a heat-resistant material such as quartz or SiC. Heat insulating plates 218 made of, for example, a heat-resistant material such as quartz or SiC, are installed in a horizontal posture and in multiple stages (not shown) below the boat 217. This configuration makes it difficult to transfer heat from the heater 207 to the seal cap 219 side. However, the present embodiment is not limited to the above-described form. For example, instead of installing the heat insulating plates 218, a heat insulating cylinder configured as a cylindrical-shape member made of a heat-resistant material such as quartz or SiC may be installed below the boat 217.

As shown in FIG. 2, a temperature sensor 263 as a temperature detector is installed in the inner tube 204. Based on a temperature information detected by the temperature sensor 263, a degree of conducting electricity to the heater 207 is adjusted so that the temperature inside the process chamber 201 becomes a desired temperature distribution. The temperature sensor 263 is configured as an L-shape, like the nozzles 410, 420, and 430, and is installed along the inner wall of the inner tube 204.

Figure 3:
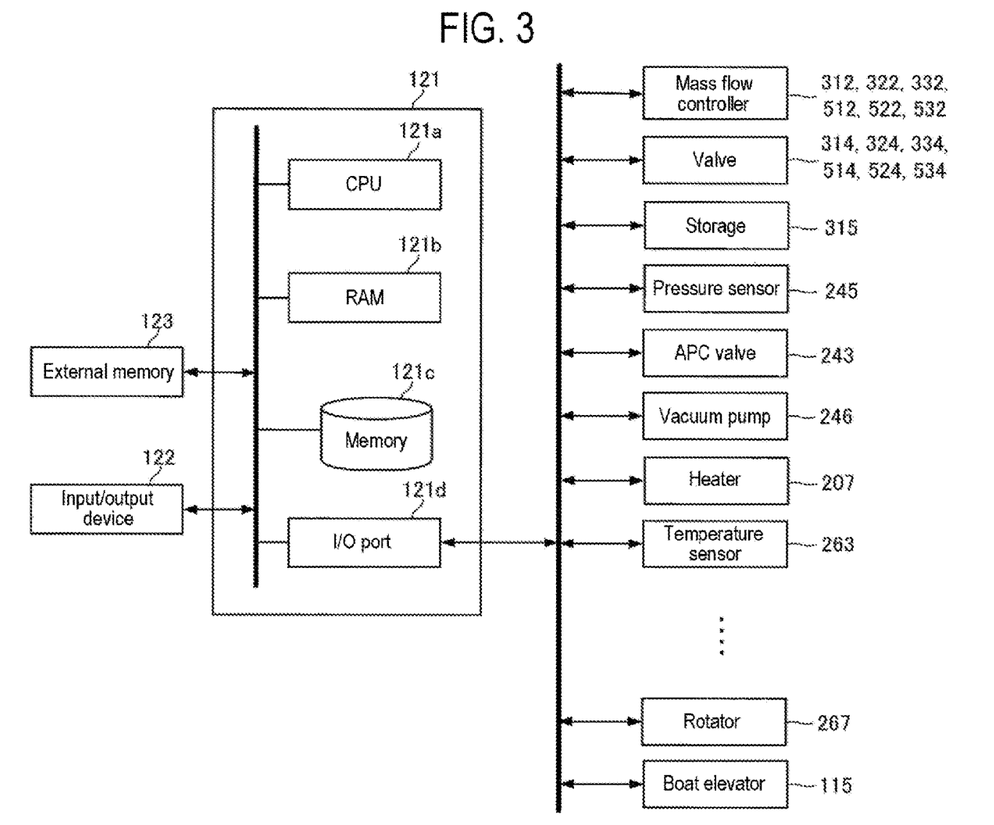
FIG. 3 is a schematic configuration diagram of a controller of the substrate processing apparatus according to the embodiment of the present disclosure, in which a control system of the controller is illustrated in a block diagram.

As shown in FIG. 3, a controller 121, which is a control part (control means), may be configured as a computer including a CPU (Central Processing Unit) 121a, a RAM (Random Access Memory) 121b, a memory 121c, and an I/O port 121d. The RAM 121b, the memory 121c, and the I/O port 121d are configured to be capable of exchanging data with the CPU 121a via an internal bus. An input/output device 122 configured as, for example, a touch panel or the like is connected to the controller 121.

The memory 121c is configured by, for example, a flash memory, a HDD (Hard Disk Drive), or the like. A control program for controlling operations of the substrate processing apparatus and a process recipe in which procedures, conditions, or the like of a method of manufacturing a semiconductor device, which will be described later, are readably stored in the memory 121c. The process recipe is a combination for causing the controller 121 to execute each step in the method of manufacturing a semiconductor device, which will be described later, to obtain a predetermined result. The process recipe functions as a program. Hereinafter, the process recipe and the control program may be generally and simply referred to as a "program." When the term "program" is used herein, it may indicate a case of including the process recipe only, a case of including the control program only, or a case of including both the process recipe and the control program. The RAM 121b is configured as a memory area (work area) in which a program or data read by the CPU 121a is temporarily stored.

The I/O port 121d is connected to the MFCs 312, 322, 332, 512, 522, and 532, the valves 314, 324, 334, 514, 524, and 534, the storage 315, the pressure sensor 245, the APC valve 243, the vacuum pump 246, the heater 207, the temperature sensor 263, the rotator 267, the boat elevator 115, and the like.

The CPU 121a is configured to read and execute the control program from the memory 121c. The CPU 121a is also configured to read the recipe from the memory 121c according to an input of an operation command from the input/output device 122. The CPU 121a is configured to be capable of controlling the flow rate adjustment operation of various kinds of gases by the MFCs 312, 322, 332, 512, 522, and 532, the opening/closing operation of the valves 314, 324, 334, 514, 524, and 534, the retaining operation of the precursor gas by the storage 315, the opening/closing operation of the APC valve 243, the pressure regulation operation performed by the APC valve 243 based on the pressure sensor 245, the temperature control operation performed by the heater 207 based on the temperature sensor 263, the actuating and stopping of the vacuum pump 246, the rotation and rotation speed adjustment operation of the boat 217 by the rotator 267, the raising or lowering operation of the boat 217 by the boat elevator 115, the accommodating operation of the wafers 200 in the boat 217, and the like, according to contents of the read recipe.

The controller 121 may be configured by installing, on the computer, the aforementioned program stored in an external memory (for example, a magnetic tape, a magnetic disk such as a flexible disk or a hard disk, an optical disc such as a CD or a DVD, a magneto-optical disc such as a MO, a semiconductor memory such as a USB memory or a memory card, and the like) 123. The memory 121c and the external memory 123 are configured as a computer-readable recording medium. Hereinafter, the memory 121c and the external memory 123 may be generally and simply referred to as a "recording medium." When the term "recording medium" is used herein, it may indicate a case of including the memory 121c only, a case of including the external memory 123 only, or a case of including both the memory 121c and the external memory 123. The provision of the program to the computer may be performed by using a communication means such as the Internet or a dedicated line, instead of using the external memory 123.

(2) Substrate Processing Process

As a process of manufacturing a semiconductor device, an example of a process of forming a film containing a first element on a wafer 200 will be described with reference to FIG. 4. The process is performed using the process furnace 202 of the above-described substrate processing apparatus 10. In the following description, the operations of various parts constituting the substrate processing apparatus 10 are controlled by the controller 121.

A substrate processing process (a process of manufacturing a semiconductor device) according to the present embodiment includes:
(a) a first step of supplying a precursor gas containing a first element and halogen to a wafer 200;
(b) a step of supplying a first reducing gas to the wafer 200;
(c) a step of supplying a second reducing gas to the wafer 200; and
(d) a second step of supplying the precursor gas to the wafer 200,
wherein the method further comprises:
(e) starting (b) during (a) and ending (a) during (b);
(f) performing (d) after (e) without purging between (e) and (d);
(g) performing (c) after (f); and
(h) forming a film containing the first element on the wafer 200 by performing (e), (f), and (g) sequentially in this order a predetermined number of times.

When the term "wafer" is used in the present disclosure, it may refer to "a wafer itself" or "a wafer and a laminated body of certain layers or films formed on a surface of a wafer." When the phrase "a surface of a wafer" is used in the present disclosure, it may refer to "a surface of a wafer itself" or "a surface of a certain layer or film formed on a wafer". When the term "substrate" is used in the present disclosure, it may be synonymous with the term "wafer."

(Wafer Loading)

When a plurality of wafers 200 are charged on the boat 217 (wafer charging), as shown in FIG. 1, the boat 217 supporting the plurality of wafers 200 is lifted up by the boat elevator 115 and is loaded into the process chamber 201 (boat loading) and accommodated in the process container. In this state, the seal cap 219 seals the lower end of the outer tube 203 via the O-ring 220.

(Pressure Regulation and Temperature Control)

The inside of the process chamber 201, that is, a space where the wafer 200 exists, is vacuum-exhausted (decompression-exhausted) by the vacuum pump 246 to reach a desired pressure (vacuum degree). In this operation, a pressure inside the process chamber 201 is measured by the pressure sensor 245. The APC valve 243 is feedback-controlled based on the measured pressure information (pressure regulation). The vacuum pump 246 always keeps in operation at least until processing on the wafers 200 is completed. The inside of the process chamber 201 is heated by the heater 207 to reach a desired temperature. In this operation, the degree of conducting electricity to the heater 207 is feedback-controlled based on the temperature information detected by the temperature sensor 263 so that the inside of the process chamber 201 has a desired temperature distribution (temperature control). The heating of the inside of the process chamber 201 by the heater 207 may be continuously performed at least until the processing on the wafers 200 is completed.

(Precursor Gas Supply (First Step), Step S10)

The valve 314 is opened to allow a precursor gas to flow into the gas supply pipe 310. After a flow rate of the precursor gas is adjusted by the MFC 312, the precursor gas is retained in the storage 315. The precursor gas is supplied into the process chamber 201 from the gas supply hole 410a of the nozzle 410 and is exhausted through the exhaust pipe 231. At the same time, the valve 514 may be opened to allow an inert gas such as a $N_2$ gas to flow into the gas supply pipe 510. Further, in order to prevent the precursor gas from penetrating into the nozzles 420 and 430, the valves 524 and 534 are opened to allow an inert gas to flow into the gas supply pipes 520 and 530. In this step, the precursor gas may be supplied into the process chamber 201, as it is, without being retained in the storage 315 (with zero retention time).

At this time, the APC valve 243 is adjusted so that the pressure inside the process chamber 201 is set to a pressure within a range of, for example, 1 to 3,990 Pa. A supply flow rate of the precursor gas controlled by the MFC 312 is set to a flow rate within a range of, for example, 0.01 to 3 slm. A supply flow rate of the inert gas controlled by the MFCs 512, 522, and 532 is set to a flow rate within a range of, for example, 0.1 to 30 slm. In the following, a temperature of the heater 207 is set to a temperature such that the temperature of the wafer 200 is a temperature within a range of, for example, 300 to 600 degrees C. The notation of a numerical range such as "1 to 3,990 Pa" in the present disclosure means that the lower limit value and the upper limit value are included in the range. Therefore, for example, "1 to 3,990 Pa" means "1 Pa or more and 3,990 Pa or less." The same applies to other numerical ranges.

In this operation, the precursor gas and the inert gas are supplied to the wafer 200. As the precursor gas, a gas containing a first element and halogen, for example, a titanium tetrachloride (TiCl$_4$) gas containing titanium (Ti) and chlorine (Cl), can be used. When the TiCl$_4$ gas is used as the precursor gas, by the supply of the TiCl$_4$ gas, TiCl$_x$ (x is an integer of 4 or less) is adsorbed on the wafer 200 (a base film on the surface of the wafer 200) to form a Ti-containing layer.

(Simultaneous Supply of Precursor Gas and First Reducing Gas, Step S11)

After the lapse of a predetermined time from a start of the supply of the precursor gas, the valve 324 is opened to start supplying a first reducing gas into the gas supply pipe 320. That is, after the start of the supply of the precursor gas, a supply of the first reducing gas is started during the supply of the precursor gas in a state where the precursor gas is supplied. A flow rate of the first reducing gas is adjusted by the MFC 322, and the first reducing gas is supplied into the process chamber 201 from the gas supply hole 420a of the nozzle 420 and is exhausted through the exhaust pipe 231. At the same time, the valves 514 and 524 are opened to allow an inert gas to flow into the gas supply pipes 510 and 520. Further, in order to prevent the first reducing gas from penetrating into the nozzle 430, the valve 534 is opened to allow an inert gas to flow into the gas supply pipe 530.

At this time, the APC valve 243 is adjusted so that the pressure inside the process chamber 201 is set to a pressure within a range of, for example, 1 to 3,990 Pa. A supply flow rate of the first reducing gas controlled by the MFC 322 is set to a flow rate within a range of, for example, 0.1 to 5 slm. A supply flow rate of the inert gas controlled by the MFCs 512, 522, and 532 is set to a flow rate within a range of, for example, 0.1 to 30 slm. A time for supplying the precursor gas and the first reducing gas simultaneously to the wafer 200 is set to a time within a range of, for example, 0.01 to 70 seconds.

In this operation, the precursor gas, the first reducing gas and the inert gas are supplied to the wafer 200. That is, at least the precursor gas and the first reducing gas have a timing (or period) at which these gases are supplied simultaneously. As the first reducing gas, for example, a silane (SiH$_4$) gas, which is a gas containing silicon (Si) and hydrogen (H), can be used.

(First Reducing Gas Supply, Step S12)

After the lapse of a predetermined time from the start of the supply of the precursor gas, the valve 314 is closed to stop the supply of the precursor gas. In other words, after the lapse of a predetermined time from the start of the supply of the first reducing gas, the supply of the precursor gas is stopped during the supply of the first reducing gas while the first reducing gas is being supplied. The flow rate of the first reducing gas is adjusted by the MFC 322, and the first reducing gas is supplied into the process chamber 201 from the gas supply hole 420a of the nozzle 420 and is exhausted through the exhaust pipe 231. At the same time, the valve 524 is opened to allow an inert gas to flow into the gas supply pipe 520. Further, in order to prevent the first reducing gas from penetrating into the nozzles 410 and 430, the valves 514 and 534 are opened to allow an inert gas to flow into the gas supply pipes 510 and 530.

At this time, the APC valve 243 is adjusted so that the pressure inside the process chamber 201 is set to a pressure within a range of, for example, 1 to 3,990 Pa. A time for supplying only the first reducing gas to the wafer 200 is set to a time within a range of, for example, 0.01 to 60 seconds.

In this operation, only the first reducing gas and the inert gas are supplied to the wafer 200. By the supply of the first reducing gas, for example, hydrogen chloride (HCl), which is a reaction by-product and an adsorption inhibitive gas, is removed, an adsorption site where HCl was adsorbed becomes vacant, and an adsorption site where TiCl$_x$ can be adsorbed may be formed on the surface of the wafer 200.

Here, in step S12, a time from an end of the precursor gas supply in the first step to an end of the first reducing gas supply is set to be longer than a time from a start of the first reducing gas supply to the end of the precursor gas supply in the first step. As a result, it is possible to form many adsorption sites on the surface of the wafer 200 on which TiCl$_x$ can be adsorbed.

(Precursor Gas Supply (Second Step), Step S13)

After the lapse of a predetermined time from the start of the supply of the first reducing gas, the valve 324 is closed to stop the supply of the first reducing and, at the same time, the valve 314 is opened to start supplying the precursor gas. In other words, immediately after stopping the supply of the first reducing gas, the supply of the precursor gas is started without purging. After a flow rate of the precursor gas is adjusted by the MFC 312, the precursor gas retained in the storage 315 is supplied into the process chamber 201 from the gas supply hole 410a of the nozzle 410 and is exhausted through the exhaust pipe 231. That is, the precursor gas is collected and retained in the storage 315 before this step, and in this step, the precursor gas retained in the storage 315 is supplied into the process chamber 201. At the same time, the valve 514 is opened to allow an inert gas to flow into the gas supply pipe 510. Further, in order to prevent the precursor gas from penetrating into the nozzles 420 and 430, the valves 524 and 534 are opened to allow an inert gas to flow into the gas supply pipes 520 and 530. Here, purging means at least reducing (removing) a gas existing on the wafer 200. The gas is removed, for example, by exhausting an internal atmosphere (an unreacted gas, by-products, etc.) of the process chamber 201. Further, the gas may be removed by supplying an inert gas into the process chamber 201 to push out a gas existing in the process chamber 201. Further, the above described exhausting and pushing-out of the inert gas may be performed in combination.

At this time, the APC valve 243 is adjusted so that the pressure inside the process chamber 201 is set to a pressure within a range of, for example, 1 to 3,990 Pa. The supply flow rate of the precursor gas controlled by the MFC 312 is set to a flow rate within a range of, for example, 0.01 to 3 slm. The supply flow rate of the inert gas controlled by the MFCs 512, 522, and 532 is set to a flow rate within a range of, for example, 0.1 to 30 slm. At this time, the time for supplying the precursor gas to the wafer 200 is set to a time within a range of, for example, 0.01 to 20 seconds.

In this operation, the same precursor gas as in the above-described first step and the inert gas are supplied to the wafer 200. After step S12, when purging, the interior of the process chamber 201 is vacuum-exhausted, which takes time to return the interior of the process chamber 201 to a high pressure, thereby lowering the productivity. As in this step, by starting the supply of the precursor gas in this step after step S12 without purging between this step and step S12, it is possible to start this step with the interior of the process chamber 201 kept in the same high pressure state as in steps S10 to S12, thereby improving the productivity.

Further, after step S12, when purging, since it takes time until the next precursor gas is supplied, reaction by-products such as SiCl$_x$ and HCl remaining in the process chamber 201 may re-adhere on the wafer 200. As in this step, by starting the supply of the precursor gas in this step after step S12 without purging between this step and step S12, it is possible to adsorb $TiCl_x$ on the wafer 200 before the reaction by-products such as $SiCl_x$ and HCl re-adhere on the wafer 200. Here, x is, for example, an integer.

Here, a time from the end of the precursor gas supply in the first step to the end of the first reducing gas supply is set to be longer than a time from the start of the first reducing gas supply to the end of the precursor gas supply in the first step. By the first reducing gas supply in this step, for example, HCl, which is a reaction by-product and an adsorption inhibitive gas, is removed, and $TiCl_x$ can be adsorbed on a vacant adsorption site of the surface of the wafer 200. This makes it possible to enhance the coverage of $TiCl_x$ and the continuity of a Ti-containing film, thereby improving the step coverage performance of a film formed in a groove.

An amount of the precursor gas supplied in the second step of step S13 is different from an amount of the precursor gas supplied in the first steps of step S10 and step S11. Specifically, a supply time of the precursor gas in the second step of step 13 is set to be longer than a supply time of the precursor gas in the first step of step S10. Further, the supply time of the precursor gas in the second step of step S13 is set to be equal to or longer than the supply time of the precursor gas in the first steps of steps S10 and S11, and specifically, the supply time of the precursor gas in the second step is set to be longer than the supply time of the precursor gas in the first step. More specifically, the supply time of the precursor gas in the second step is set to be within twice the supply time of the precursor gas in the first step. This makes it possible to enhance the coverage of $TiCl_x$ and the continuity of the Ti-containing film, thereby improving the step coverage performance of the film formed in the groove.

Further, the supply flow rate of the precursor gas in the second step of step S13 is set to a flow rate equal to or greater than the supply flow rate of the precursor gas in the first steps of step S10 and S11, and specifically, the supply flow rate of the precursor gas in the second step is set to be greater that the supply flow rate of the precursor gas in the first step. This makes it possible to enhance the coverage of $TiCl_x$ and the continuity of the Ti-containing film, thereby improving the step coverage performance of the film formed in the groove.

Further, the precursor gas supply in the second step of step S13 may be performed in a state where the precursor gas is retained in the storage 315. A step of retaining the precursor gas in the storage 315 may be performed before step S13. Further, the precursor gas supply in the first step of step S10 may also be performed in a state where the precursor gas is retained in the storage 315. When the precursor gas retained in the storage 315 is supplied in step S10, a step of retaining the precursor gas in the storage 315 may be performed before step S10. The step of retaining the precursor gas in the storage 315 is performed by closing the valve 314 for a predetermined time.

Here, an amount of the precursor gas retained in the storage 315 before the precursor gas supply in the second step of step S13 is set to be larger than an amount of the precursor gas retained in the storage 315 before the precursor gas supply in the first step of step S10. Further, a time for retaining the precursor gas in the storage 315 before the precursor gas supply in the second step of step S13 is set to be longer than a time for retaining the precursor gas in the storage 315 before the precursor gas supply in the first step of step S10. Further, a supply flow rate when the precursor gas is retained in the storage 315 before the precursor gas supply in the second step of step S13 is set to be greater than a supply flow rate when the precursor gas is retained in the storage 315 before the precursor gas supply in the first step of step S10. This makes it possible to enhance the coverage of $TiCl_x$ and the continuity of the Ti-containing film, thereby improving the step coverage performance of the film formed in the groove. Further, before the precursor gas supply in the first step, the precursor gas may be supplied to the process chamber 201 without being retained in the storage 315 (with zero retention time).

(Purging: Step S14)

After the lapse of a predetermined time from the start of the supply of the precursor gas in the second step, the valve 314 is closed to stop the supply of the precursor gas. At this time, with the APC valve 243 of the exhaust pipe 231 left open, the interior of the process chamber 201 is vacuum-exhausted by the vacuum pump 246 to remove a residual gas from the wafer 200 so that the unreacted precursor gas, first reducing gas, and reaction by-products remaining in the process chamber 201 are excluded from the process chamber 201. At this time, the valves 514, 524, and 534 are opened to allow an inert gas as a purge gas to be supplied into the process chamber 201. The inert gas can act as the purge gas to remove the residual gas from the wafer 200, thereby enhancing the effect of excluding the unreacted precursor gas, first reducing gas, and reaction by-products remaining in the process chamber 201 from the process chamber 201. The supply flow rate of the inert gas controlled by the MFCs 512, 522, and 532 is set to, for example, 0.1 to 30 slm.

(Second Reducing Gas Supply: Step S15)

After the lapse of a predetermined time from the start of the purging, the valve 334 is opened to allow a second reducing gas to flow into the gas supply pipe 330. A flow rate of the second reducing gas is adjusted by the MFC 332, and the second reducing gas is supplied into the process chamber 201 from the gas supply hole 430a of the nozzle 420 and is exhausted through the exhaust pipe 231. At the same time, the valve 534 is opened to allow an inert gas to flow into the gas supply pipe 530. Further, in order to prevent the second reducing gas from penetrating into the nozzles 410 and 420, the valves 514 and 524 are opened to allow an inert gas to flow into the gas supply pipes 510 and 520.

At this time, the APC valve 243 is adjusted so that the pressure inside the process chamber 201 is set to a pressure within a range of, for example, 1 to 3,990 Pa. A supply flow rate of the second reducing gas controlled by the MFC 332 is set to a flow rate within a range of, for example, 0.1 to 30 slm. A supply flow rate of the inert gas controlled by the MFCs 512, 522, and 532 is set to a flow rate within a range of, for example, 0.1 to 30 slm. A time for supplying the second reducing gas to the wafer 200 is set to a time within a range of, for example, 0.01 to 30 seconds.

In this operation, the second reducing gas and the inert gas are supplied to the wafer. Here, as the second reducing gas, it may be possible to use, e.g., an ammonia ($NH_3$) gas. When the $NH_3$ gas is used as the second reducing gas, the $NH_3$ gas undergoes a substitution reaction with at least a portion of the Ti-containing layer formed on the wafer 200. At the time of the substitution reaction, Ti contained in the Ti-containing layer and N contained in the $NH_3$ gas are bonded to form a TiN layer on the wafer 200. Specifically, when $TiCl_x$ adsorbed on the wafer 200 reacts with $NH_3$, a TiN film is formed on the wafer 200 with an oxide film formed on the surface of the wafer 200, thereby enhancing the coverage of the TiN film. In addition, reaction by-products such as HCl, ammonium chloride ($NH_4Cl$), and $H_2$ are produced at the time of the substitution reaction.

(Purging: Step S16)

After the lapse of a predetermined time from a start of the supply of the second reducing gas, the valve 334 is closed to stop the supply of the second reducing. At this time, with the APC valve 243 of the exhaust pipe 231 left open, the interior of the process chamber 201 is vacuum-exhausted by the vacuum pump 246 to remove a residual gas from the wafer 200 so that the unreacted second reducing gas or the second reducing gas after contributing to the formation of the film and reaction by-products remaining in the process chamber 201 are excluded from the process chamber 201. At this time, the valves 514, 524, and 534 are opened to allow an inert gas as a purge gas to be supplied into the process chamber 201. The inert gas can act as the purge gas to remove the residual gas from the wafer 200, thereby enhancing the effect of excluding the unreacted second reducing gas and the reaction by-products remaining in the process chamber 201 from the process chamber 201. The supply flow rate of the inert gas controlled by the MFCs 512, 522, and 532 is set to, for example, 0.1 to 30 slm.

That is, as purging is not performed after the first reducing gas is supplied, the precursor gas is supplied without purging being sandwiched; purging is then performed; and subsequently, the second reducing gas is supplied.

(Performing Predetermined Number of Times)

By performing a cycle a predetermined number of times (n times) (once or more), the cycle including sequentially performing the described-above steps S10 to S16, a film including a first element of a predetermined thickness is formed on the wafer 200. Here, for example, a titanium nitride (TiN) film is formed.

(After-Purging and Returning to Atmospheric Pressure)

An inert gas is supplied into the process chamber 201 from each of the gas supply pipes 510 to 530 and is exhausted through the exhaust pipe 231. The inert gas acts as a purge gas, whereby the interior of the process chamber 201 is purged with the inert gas to remove a gas and reaction by-products remaining in the process chamber 201 from the process chamber 201 (after-purging). After that, the internal atmosphere of the process chamber 201 is substituted with the inert gas (inert gas substitution), and the pressure inside the process chamber 201 is returned to the atmospheric pressure (returning to atmospheric pressure).

(Wafer Unloading)

After that, the seal cap 219 is moved down by the boat elevator 115 to open the lower end of the outer tube 203. Then, the processed wafers 200 supported by the boat 217 are unloaded from the lower end of the outer tube 203 to the outside of the outer tube 203 (boat unloading). After that, the processed wafers 200 are discharged from the boat 217 (wafer discharging).

(3) Effects of the Present Embodiment

According to the present embodiment, one or more effects set forth below may be achieved.
 (a) It is possible to improve the step coverage performance of a film.
 (b) Since the coverage of the film can be enhanced, it is possible to reduce the resistivity of a metal-containing film formed on the film.
 (c) It is possible to enhance the continuity of the film. Here, the "continuity" refers that the crystals of the film material are continuous, the crystal spacing is small, etc.
 (d) It is possible to improve the characteristics of the film formed on the substrate.

(4) Other Embodiments

The embodiment of the present disclosure has been specifically described above. However, the present disclosure is not limited to the above-described embodiment, and various modifications can be made without departing from the gist thereof.

(Modification 1)

Figure 4:
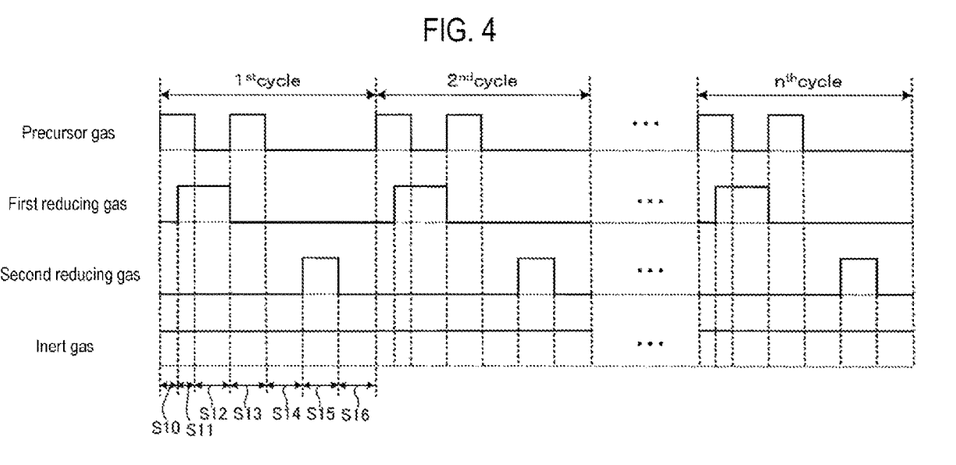
FIG. 4 is a diagram showing a substrate processing sequence according to an embodiment of the present disclosure.
Figure 5:
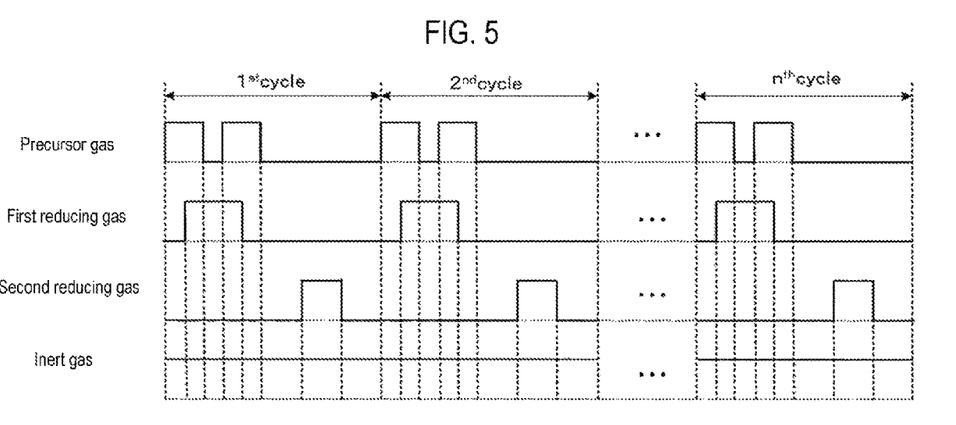
FIG. 5 is a diagram showing a modification of the substrate processing sequence according to the embodiment of the present disclosure.

FIG. 5 shows a modification of the substrate processing sequence according to the embodiment of the present disclosure. In this modification, as described above, the precursor gas supply in the second step is started during the supply of the first reducing gas. That is, the precursor gas supply is restarted before the first reducing gas supply is ended. Even in this case, as the same effects as the above-described substrate processing sequence shown in FIG. 4, it is possible to enhance the coverage of $TiCl_x$ and the continuity of the Ti-containing film, thereby improving the step coverage performance of the film formed in the groove.

(Modification 2)

Figure 6:
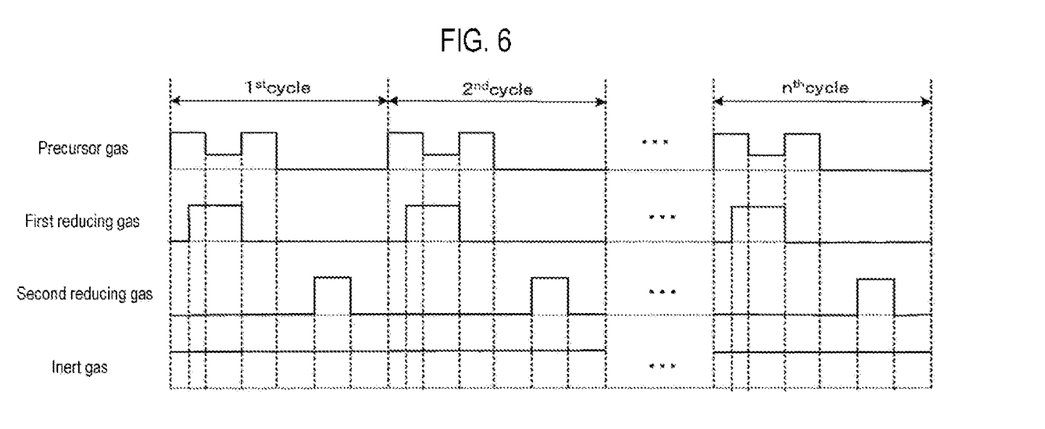
FIG. 6 is a diagram showing another modification of the substrate processing sequence according to the embodiment of the present disclosure.

FIG. 6 shows another modification of the substrate processing sequence according to the embodiment of the present disclosure. In this modification, in the above-described step S12 between the precursor gas supply in the first step and the precursor gas supply in the second step, the precursor gas is supplied with the amount thereof smaller than that in the precursor gas supply in the first step. That is, after the lapse of a predetermined time from the start of the first reducing gas supply, the flow rate of the precursor gas is reduced, and after the lapse of a predetermined time from the start of the first reducing gas supply, the flow rate of the precursor gas is increased at the same time as the stop of the first reducing gas supply. Even in this case, as the same effects as the above-described substrate processing sequence shown in FIG. 4, it is possible to enhance the coverage of $TiCl_x$ and the continuity of the Ti-containing film, thereby improving the step coverage performance of the film formed in the groove.

Further, in the above embodiment, the case where the precursor gas supply in the second step is performed without purging after the first reducing gas supply has been described, but the present disclosure is not limited thereto. For example, the precursor gas supply in the second step may be performed after purging in a short time after the first reducing gas supply.

Further, in the above embodiment, the case of using, for example, the $TiCl_4$ gas containing Ti and Cl as the precursor gas as a gas containing a first element and halogen has been described, but the present disclosure is not limited thereto. For example, the present disclosure may be also suitably applied to a case of using a gas containing at least one of a different metal element, a transition metal element, and a Group XIV element, and a halogen element, as the precursor gas.

The Group XIV element is, for example, silicon (Si) or germanium (Ge). In the case of Si, a gas containing Si and halogen, that is, a halosilane gas, can be used. The halogen includes chlorine (Cl), fluorine (F), bromine (Br), iodine (I), and the like. As the halosilane gas, for example, a chlorosilane gas containing Si and Cl can be used.

Specifically, as the precursor gas, it may be possible to use, e.g., a chlorosilane gas such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane (SiCl$_4$, abbreviation: STC) gas, a hexachlorodisilane gas (Si$_2$Cl$_6$, abbreviation: HCDS) gas, or an octachlorotrisilane (Si$_3$Cl$_8$, abbreviation: OCTS) gas. One or more of these gases can be used as the precursor gas.

Further, examples of the different metal element (including the transition element) include hafnium (Hf), zirconium (Zr), aluminum (Al), molybdenum (Mo), tungsten (W), and the like. The present disclosure can also be suitably applied to a case of using a gas containing at least one of these metal elements and a halogen element.

As such a gas, it may be possible to use, e.g., a gas such as a hafnium tetrachloride (HfCl$_4$) gas, a zirconium tetrachloride (ZrCl$_4$) gas, an aluminum trichloride (AlCl$_3$) gas, a molybdenum dichloride dioxide (MoO$_2$Cl$_2$) gas, or a tungsten hexafluoride (WF$_6$) gas.

Further, in the above embodiment, the case where the SiH$_4$ gas is used as the first reducing gas has been described, but the present disclosure is not limited thereto. For example, a gas containing hydrogen (H) may be used as the first reducing gas. For example, the present disclosure can also be suitably applied to a case of using a silane-based gas such as disilane (Si$_2$H$_6$) or trisilane (Si$_3$H$_8$), or a borane-based gas such as monoborane (BH$_3$) or diborane (B$_2$H$_6$), as the first reducing gas.

Further, in the above embodiment, the case where the NH$_3$ gas is used as the second reducing gas has been described, but the present disclosure is not limited thereto. For example, a gas containing hydrogen (H) may be used as the second reducing gas. For example, the present disclosure can also be suitably applied to a case of using a nitrogen-containing gas such as diazene (N$_2$H$_2$), triazene (N$_3$H$_3$), or hydrazine (N$_2$H$_4$).

Further, in the above embodiment, the example in which a film is formed using the substrate processing apparatus which is a batch-type substrate processing apparatus capable of processing a plurality of substrates at a time has been described, but the present disclosure is not limited thereto. For example, the present disclosure can be suitably applied to even a case where a film is formed using a single-wafer type substrate processing apparatus capable of processing a single substrate or several substrates at a time.

A process recipe (a program in which the processing procedure, process conditions, and the like are written) used for forming these various types of thin films may be prepared individually (in plural) according to the substrate processing contents (film type, composition ratio, film quality, film thickness, processing procedure, process conditions, and the like of a thin film to be formed). Then, when starting the substrate processing, a proper process recipe may be appropriately selected from a plurality of process recipes according to the contents of the substrate processing. Specifically, the plurality of process recipes individually prepared according to the contents of the substrate processing may be stored (installed) in advance in the memory 121$c$ included in the substrate processing apparatus via a telecommunication line or a recording medium (the external memory 123) on which the process recipes are recorded. Then, when starting the substrate processing, the CPU 121$a$ included in the substrate processing apparatus may appropriately select a proper process recipe from the plurality of process recipes stored in the memory 121$c$ according to the contents of the substrate processing. With this configuration, it is possible to form thin films of various film types, composition ratios, film qualities, and film thicknesses with a single substrate processing apparatus in a versatile and well-reproducible manner. Further, it is possible to reduce an operator's operation burden (input burden of processing procedure, process conditions, etc.) and to quickly start the substrate processing while avoiding an operation error.

Further, the present disclosure can also be realized by, for example, changing a process recipe of the existing substrate processing apparatus. When changing a process recipe, the process recipe according to the present disclosure may be installed on the existing substrate processing apparatus via a telecommunications line or a recording medium on which the process recipe is recorded, or it is also possible to change a process recipe of the existing substrate processing apparatus to the process recipe according to the present disclosure by operating an input/output device of the existing substrate processing apparatus.

Further, the present disclosure can be used for, for example, a word line portion of a NAND flash memory or DRAM having a three-dimensional structure.

Although various typical embodiments of the present disclosure have been described above, the present disclosure is not limited to those embodiments, and such embodiments may be used in proper combination.

Hereinafter, Implementation Examples will be described.

Example 1

Figure 7:
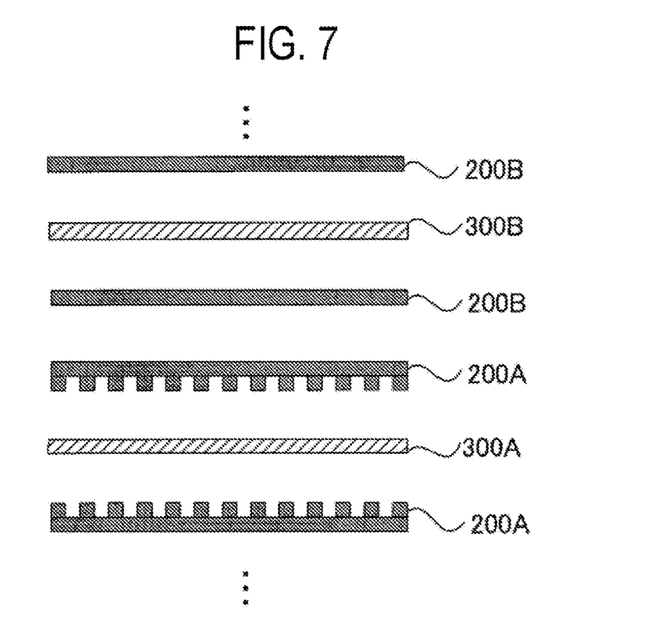
FIG. 7 is a diagram for explaining an evaluation method used in an Implementation Example.

By using the substrate processing apparatus 10 shown in FIG. 1, the substrate processing sequence shown in FIG. 4 for this Implementation Example and a substrate processing sequence according to a Comparative Example were performed for a monitor wafer 300A mounted to be sandwiched between pattern-formed surfaces of pattern wafers 200A and a monitor wafer 300B mounted to be sandwiched between bare wafers 200B with no pattern being formed, in the boat 217, as shown in FIG. 7.

In the substrate processing sequence in the Comparative Example, the precursor gas supply in the second step of step S13 in the substrate processing sequence shown in FIG. 4 was not performed. That is, by performing a cycle a predetermined number of times, the cycle including sequentially performing the precursor gas supply in the above-described step S10, the simultaneous supply of the precursor gas and the first reducing gas in the above-described step S11, the first reducing gas supply in the above-described step S12, the purging in the above-described step S14, the second reducing gas supply in the above-described step S15, and the purging in the above-described step S16, a TiN film was formed on the wafer.

Further, in this Implementation Example and the Comparative Example, as an example, a TiCl$_4$ gas was used as the precursor gas, a SiH$_4$ gas was used as the first reducing gas, and an NH$_3$ gas was used as the second reducing gas.

Figure 8:
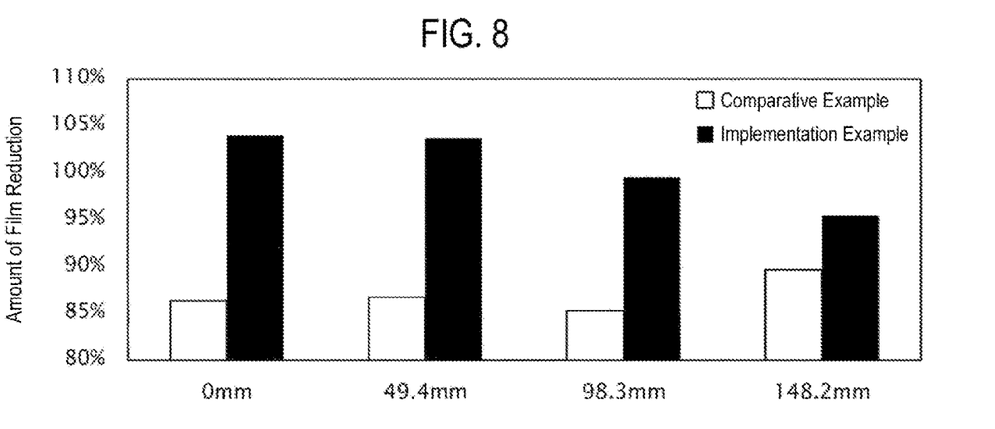
FIG. 8 is a diagram showing a comparison in an amount of film thickness reduction between when the substrate processing sequence shown in FIG. 4 according to the present Implementation Example is used and when a substrate processing sequence according to a Comparative example is used.

As shown in FIG. 8, the film thicknesses (at 0 mm, 49.4 mm, 98.3 mm, and 148.2 mm from the centers of the monitor wafers 300A and 300B) of TiN films formed on the monitor wafers 300A and 300B when the substrate processing sequence in the Comparative Example is used and when the substrate processing sequence in this Implementation Example is used were measured, respectively, and a ratio of film reduction of the monitor wafer 300A with respect to the position of the monitor wafer 300B was evaluated.

The surface area of the surface on which the pattern of the pattern wafer 200A is formed has 25 times the surface area of the bare wafer 200B. Then, the film thickness of the TiN film formed on the surface of the monitor wafer 300A, which is a surface facing the surface on which the pattern of the pattern wafer 200A is formed, was set to be equal to the film thickness of the TiN film formed on the wafer on which the pattern is formed, and the step coverage was evaluated.

As FIG. 8 shows that an amount of film thickness reduction in the entire in-plane region when the substrate processing sequence according to this Implementation Example is used is smaller than that when the substrate processing sequence according to the Comparative example is used, the improvement of the step coverage was confirmed.

Example 2

In this Implementation Example, using the substrate processing apparatus 10 shown in FIG. 1, the substrate processing sequence shown in FIG. 4 was performed for the monitor wafer 300A mounted to be sandwiched between pattern-formed surfaces of the pattern wafers 200A and the monitor wafer 300B mounted to be sandwiched between the bare wafers 200B, in the boat 217, as shown in FIG. 7.

Specifically, in the above-described substrate processing sequence of FIG. 4, a process of supplying the precursor gas for 1 second in step S10, supplying the precursor gas and the first reducing gas for 4 seconds in step S11, supplying the first reducing gas for 15 seconds in step S12, and supplying the precursor gas for 5 seconds, 7.5 seconds, 10 seconds, and 15 seconds in step S13, was performed a predetermined number of times, and the ratio of film reduction of a film formed on the monitor wafer 300A with respect to the monitor wafer 300B was evaluated. The other processing conditions were set to predetermined conditions within the range of processing conditions described in the above-described embodiment. Further, in this Implementation Example, as an example, a TiCl$_4$ gas was used as the precursor gas, a SiH$_4$ gas was used as the first reducing gas, and an NH$_3$ gas was used as the second reducing gas.

Figure 9:
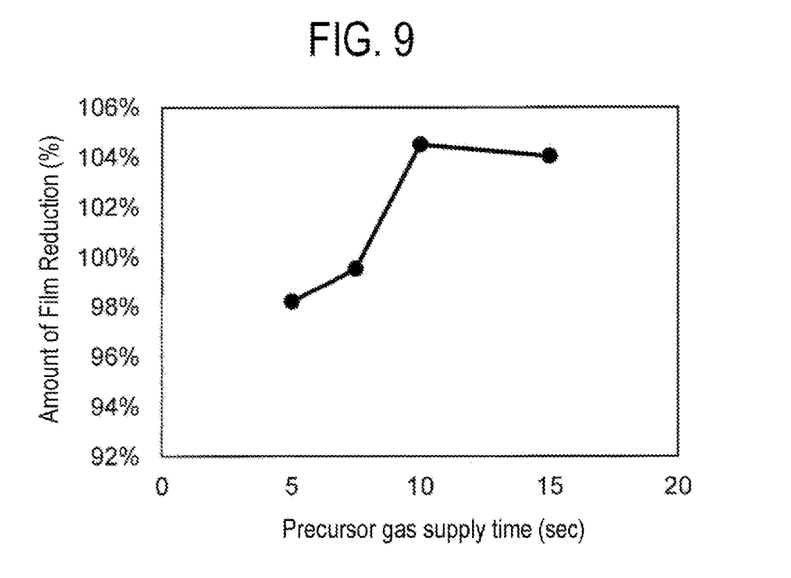
FIG. 9 is a diagram showing a relationship between a supply time of a precursor gas and the amount of film thickness reduction.

FIG. 9 is a diagram showing the relationship between the supply time of the precursor gas in step S13 and the amount of film reduction.

As shown in FIG. 9, it was confirmed that as the supply time of the precursor gas in the second step of step S13 becomes longer, specifically about 5 to 15 seconds, the amount of film reduction becomes smaller and the step coverage is improved.

According to the present disclosure in some embodiments, it is possible to improve the step coverage performance of a film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
   forming a film containing a first element on the substrate by performing a cycle a predetermined number of times,
   wherein the cycle includes performing:
   (a) supplying a precursor gas containing the first element and halogen to the substrate;
   (b) supplying the precursor gas and a first reducing gas to the substrate, wherein (b) is started simultaneously with an end of (a) and the first reducing gas is silane-based gas or borane-based gas;
   (c) supplying the first reducing gas to the substrate, wherein (c) is started simultaneously with an end of (b);
   (d) supplying the precursor gas to the substrate, wherein (d) is started simultaneously with an end of (c); and
   (e) supplying a second reducing gas to the substrate after (d) is performed, wherein the second reducing gas contains nitrogen and hydrogen; and wherein (d) includes performing: (d1) supplying the precursor gas without supplying the first reducing gas and the second reducing gas.

2. The method of claim 1, wherein in (c), the precursor gas is further supplied to the substrate with an amount smaller than an amount supplied in (a) and (b).

3. The method of claim 1, wherein an amount of the precursor gas supplied in (d) is different from an amount of the precursor gas supplied in (a) and (b).

4. The method of claim 1, wherein a supply time of the precursor gas in (d) is set to be equal to or longer than a supply time of the precursor gas in (a) and (b).

5. The method of claim 1, wherein a supply flow rate of the precursor gas in (d) is set to be equal to or greater than a supply flow rate of the precursor gas in (a) and (b).

6. The method of claim 1, further comprising retaining the precursor gas in a storage in one or both of before (d) and before (a),
   wherein in (a) and (b), at least a part of the precursor gas, which has been retained in the storage before (a), is supplied to the substrate, and
   wherein in (d), at least a part of the precursor gas, which has been retained in the storage before (d), is supplied to the substrate.

7. The method of claim 6, wherein an amount of the precursor gas retained in the storage before (d) is set to be larger than an amount of the precursor gas retained in the storage before (a).

8. The method of claim 6, wherein a time for retaining the precursor gas in the storage before (d) is set to be longer than a time for retaining the precursor gas in the storage before (a).

9. The method of claim 6, wherein a supply flow rate when the precursor gas is retained in the storage before (d) is set to be greater than a supply flow rate when the precursor gas is retained in the storage before (a).

10. The method of claim 1, wherein a time from a start of (b) to an end of (b) is set to be longer than a time from a start of (c) to the end of (c).

11. A method of manufacturing a semiconductor device comprising the method of claim 1.

12. The method of claim 1, wherein in (c), the precursor gas is not supplied.

13. The method of claim 1, wherein the first element is one selected from the group of a Group XIV element, a metal element, and a transition metal element.

14. The method of claim 1, wherein (d) includes performing:
   (d2) supplying the precursor gas and the first reducing gas to the substrate before performing (d1).

15. The method of claim 1, wherein in (d), the first reducing gas is not supplied to the substrate.

16. The method of claim 1, wherein the film is composed of a nitride of the first element.

* * * * *